United States Patent
Lee et al.

(10) Patent No.: US 10,115,757 B2
(45) Date of Patent: Oct. 30, 2018

(54) IMAGE SENSOR AND ELECTRONIC DEVICE HAVING THE SAME

(71) Applicant: SK hynix Inc., Gyeonggi-do (KR)

(72) Inventors: Won-Jun Lee, Gyeonggi-do (KR); Kyoung-In Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 14/743,959

(22) Filed: Jun. 18, 2015

(65) Prior Publication Data
US 2016/0056195 A1  Feb. 25, 2016

(30) Foreign Application Priority Data

Aug. 22, 2014 (KR) .................. 10-2014-0109587
Apr. 6, 2015 (KR) .................. 10-2015-0048436

(51) Int. Cl.
| | |
|---|---|
| *H01L 31/0232* | (2014.01) |
| *H01L 27/146* | (2006.01) |
| *H01L 31/0216* | (2014.01) |
| *G02B 1/11* | (2015.01) |
| *G02B 13/00* | (2006.01) |

(52) U.S. Cl.
CPC .. *H01L 27/14627* (2013.01); *H01L 27/14621* (2013.01); *H01L 31/02162* (2013.01); *H01L 31/02327* (2013.01); *G02B 1/11* (2013.01); *G02B 13/0085* (2013.01); *H01L 27/14645* (2013.01)

(58) Field of Classification Search
CPC ......... H01L 27/14627; H01L 27/14621; H01L 27/1462; H01L 27/14645; H01L 31/02327; H01L 31/0216; G02B 1/11; G02B 13/0085
See application file for complete search history.

(56) References Cited

U.S. PATENT DOCUMENTS

| | | | |
|---|---|---|---|
| 7,557,337 B2 * | 7/2009 | Jiang ................ | H01L 27/14627 250/216 |
| 2001/0036014 A1 * | 11/2001 | Sasano ................ | G02B 3/0018 359/619 |
| 2005/0048690 A1 * | 3/2005 | Yamamoto .......... | H01L 31/0232 438/69 |
| 2005/0122417 A1 * | 6/2005 | Suzuki ................ | H01L 27/1462 348/340 |
| 2005/0135897 A1 * | 6/2005 | Swim, Jr. .............. | F16B 35/041 411/386 |
| 2006/0011932 A1 | 1/2006 | Kim | |
| 2007/0035847 A1 * | 2/2007 | Li ........................ | G02B 3/0012 359/642 |

(Continued)

FOREIGN PATENT DOCUMENTS

WO     WO 2014/122804     8/2014

OTHER PUBLICATIONS

Office Action issued by the Taiwanese Intellectual Property Office dated Jun. 29, 2018.

*Primary Examiner* — A. Sefer
(74) *Attorney, Agent, or Firm* — IP & T Group LLP

(57) ABSTRACT

An image sensor may include: a substrate including a substrate comprising a photoelectric conversion element; a pixel lens formed over the substrate and comprising a plurality of light condensing layers in which a lower layer has a larger area than an upper layer; a color filter layer covering the pixel lens; and an anti-reflection structure formed over the color filter layer.

20 Claims, 8 Drawing Sheets

(56) References Cited

U.S. PATENT DOCUMENTS

| | | | |
|---|---|---|---|
| 2009/0200623 A1* | 8/2009 | Qian | G02B 3/0018 257/432 |
| 2010/0133421 A1* | 6/2010 | Im | H01L 27/14621 250/227.2 |
| 2010/0208368 A1 | 8/2010 | Yin et al. | |
| 2011/0008920 A1* | 1/2011 | Yin | H01L 27/14627 438/29 |
| 2011/0062476 A1* | 3/2011 | Tobise | G02B 3/0031 257/98 |
| 2012/0012960 A1* | 1/2012 | Yang | H01L 27/14627 257/432 |
| 2012/0273907 A1* | 11/2012 | Lim | H01L 27/14621 257/432 |
| 2015/0171136 A1* | 6/2015 | Chien | H01L 27/14685 257/432 |
| 2015/0270303 A1* | 9/2015 | Han | H01L 27/14627 250/208.1 |
| 2016/0073065 A1* | 3/2016 | Lee | H01L 27/14627 348/273 |

\* cited by examiner

IMAGE SENSOR AND ELECTRONIC DEVICE HAVING THE SAME

CROSS-REFERENCE TO RELATED APPLICATIONS

The present application claims priority of Korean Patent Application Nos. 10-2014-0109587 and 10-2015-0048436, filed on Aug. 22, 2014 and Apr. 6, 2015, respectively, which are herein incorporated by reference in their entirety.

BACKGROUND

Exemplary embodiments of the present invention relate to a semiconductor device fabrication technology, and more particularly, to an image sensor including a light condensing member with a multilayer stepped structure and an electronic device having the same.

An image sensor refers to a device which converts an optical image into an electrical signal. Recently, due to the development of the computer industry and the communication industry, a demand for an image sensor with improved performance has increased in various fields such as digital cameras, camcorders, PCS (Personal Communication System), game machines, security cameras, medical micro-cameras, and robots.

SUMMARY

Various embodiments are directed to an image sensor with improved performance and an electronic device having the same.

In an embodiment, an image sensor may include: a substrate comprising a photoelectric conversion element; a pixel lens formed over the substrate and comprising a plurality of light condensing layers in which a lower layer has a larger area than an upper layer; a color filter layer covering the pixel lens; and an anti-reflection structure formed over the color filter layer. The image sensor may further include a focusing layer provided between the photoelectric conversion element and the pixel lens. And The image sensor may further include an anti-reflection layer formed over the pixel lens.

The focusing layer may have a larger refractive index than the pixel lens. The focusing layer may have the same area as or a larger area than the pixel lens. A focal distance between the pixel lens and the photoelectric conversion element may be inversely proportional to the thickness of the focusing layer. The pixel lens may have a multilayer stepped structure. The lower layer exposed by the upper layer may have a smaller width than the wavelength of incident light. The lower layer exposed by the upper layer may have a smaller width than the wavelength of incident light which colors are separated through the color filter layer. The plurality of light condensing layers may have the same shape and be arranged in parallel to each other. The upper layer may have the same thickness as or a smaller thickness than the lower layer. The upper layer may have the same refractive index as or a smaller refractive index than the lower layer. The color filter layer may cover the entire surface of the pixel lens and have a flat top surface. The color filter layer may have a smaller refractive index than the pixel lens. The anti-reflection structure may include an anti-reflection layer or a hemi-spherical lens.

In an embodiment, an electronic device may include: an optical system; an image sensor suitable for receiving light from the optical system and comprising a pixel array in which a plurality of unit pixels are arranged in a matrix shape; and a signal processing unit suitable for processing a signal outputted from the image sensor. Each of the unit pixels may include: a substrate comprising a photoelectric conversion element; a pixel lens formed over the substrate and comprising a plurality of light condensing layers in which a lower layer has a larger area than an upper layer; a color filter layer covering the pixel lens; and an anti-reflection structure formed over the color filter layer. The electronic device may further include a focusing layer provided between the photoelectric conversion element and the pixel lens.

The focusing layer may have a larger refractive index than the pixel lens. The color filter layer may have a smaller refractive index than the pixel lens. A focal distance between the pixel lens and the photoelectric conversion element may be inversely proportional to the thickness of the focusing layer. The lower layer exposed by the upper layer may have a smaller width than the wavelength of incident light.

DETAILED DESCRIPTION

Figure 1:
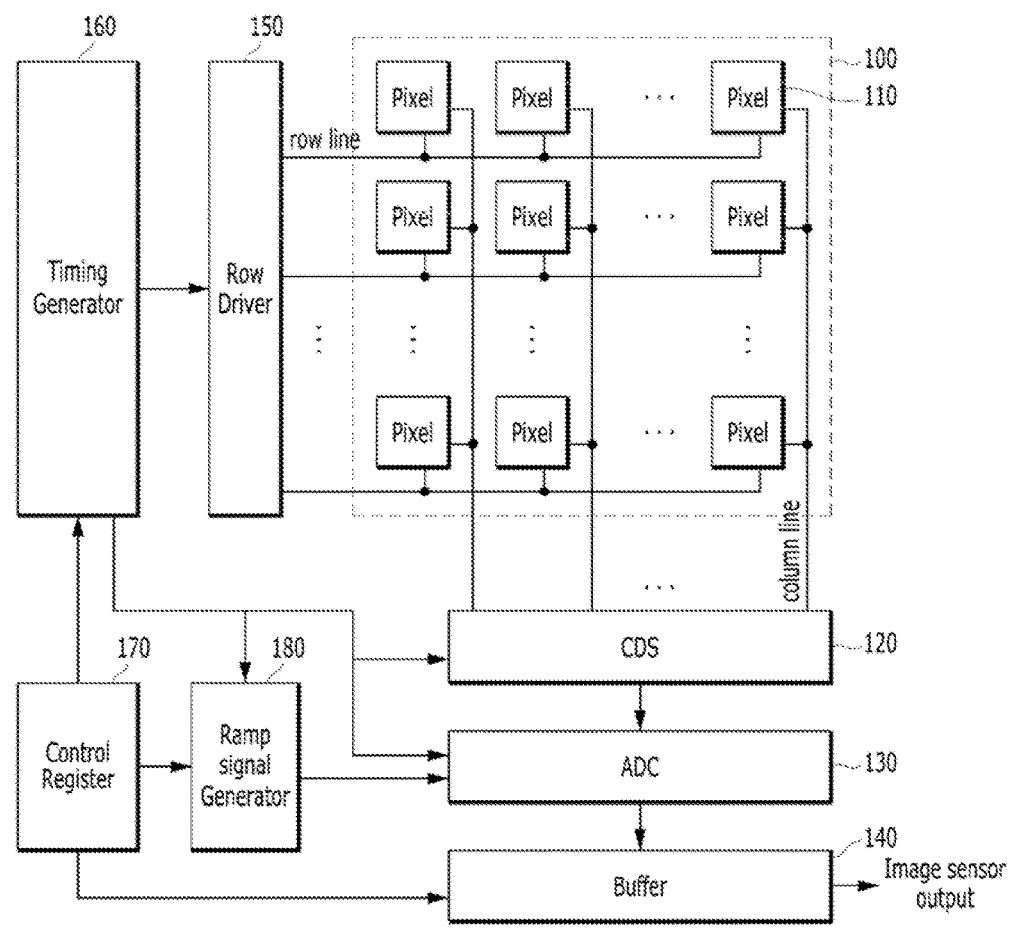
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The embodiments of the present invention provide an image sensor with improved performance and an electronic device having the same. When light condensing efficiency in unit pixels improves, performance of the image sensor improves accordingly. In general, an image sensor may include a plurality of unit pixels. Each of the unit pixels may include a semi-spherical type micro lens (ML) installed over a photoelectric conversion element. Through the micro lens, incident light may be condensed and transmitted into the photoelectric conversion element. The light condensing efficiency of the unit pixel may depend on quality of the micro lens. The light condensing efficiency may be controlled according to a focal distance between the micro lens and the photoelectric conversion element.

In a conventional micro lens, the focal distance between the micro lens and, the photoelectric conversion element is likely to change during a process of changing the curvature of the micro lens. Thus, it is not easy to control the focal distance.

The micro lens may be formed through a process of reflowing a lens forming material, for example, resist. In such a process, it is difficult to form a hemispherical shape with a desired curvature. Furthermore, since the micro lens is formed over a color filter layer, applicable materials are limited. In addition, the reflow process may require a high cost, may be formed only as a hemispherical shape, and may have difficulties in forming a micro lens with a symmetrical and uniform shape. This may increases crosstalk.

The following embodiments of the present invention provide an image sensor with improved light condensing efficiency in unit pixels and an electronic device having the same. For this structure, each of the unit pixels may include a pixel lens having a plurality of light condensing layers which are formed over a photoelectric conversion element. A lower layer of the plurality of light condensing layers has a larger area or critical dimension (CD) than an upper layer of the plurality of light condensing layers. Thus, the pixel lens may have a multilayer stepped structure. The pixel lens having a multilayer stepped structure exhibits sub-wavelength optics or sub-wavelength effects and can condense incident light as a hemispherical micro lens does. The pixel lens can effectively condense light within a limited area. Thus, the pixel lens according to an embodiment is advantageous in increasing integration of the image sensor and can easily vary a focal distance. According to the sub-wavelength optics, an optical effect can be obtained in a spatial scale smaller than a half of a wavelength of incident light.

FIG. 1 is a block diagram schematically illustrating an image sensor in accordance with an embodiment of the present invention.

As illustrated in FIG. 1, the image sensor in accordance with the embodiment of the present invention may include a pixel array 100, a correlated double sampling (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix shape.

The timing generator 160 may generate one or more control signals for controlling the row driver 150, the CDS 120, the ADC 130, and the ramp signal generator 180. The control register 170 may generate one or more control signals for controlling the ramp signal generator 180, the timing generator 160, and the buffer 140.

The row driver 150 may drive the pixel array 100 on a row line basis. For example, the row driver 150 may generate a select signal for selecting any one row line of a plurality of row lines. Each of the unit pixels 110 may sense incident light and output an image reset signal and an image signal to the CDS 120 through a column line. The CDS 120 may perform sampling on the image reset signal and the image signal.

The ADC 130 may compare a ramp signal outputted from the ramp signal generator 180 with a sampling signal outputted from the CDS 120, and output a comparison signal. According to a clock signal provided from the timing generator 160, the ADC 130 may count the level transition time of the comparison signal, and output the count value to the buffer 140. The ramp signal generator 180 may be operated under control of the timing generator 160.

The buffer 140 may store a plurality of digital signals outputted from the ADC 130, and then sense and amplify the digital signals. Thus, the buffer 140 may include a memory (not illustrated) and a sense amplifier (not illustrated). The memory may serve to store count values. The count values are related to signals outputted from the plurality of unit pixels 110. The sense amplifier may serve to sense and amplify the count values outputted from the memory.

In the above-described image sensor, each of the unit pixels may include a pixel lens capable of improving light condensing efficiency. Hereinafter, a unit pixel including a pixel lens will be described in detail with reference to the accompanying drawings.

Figure 2A:
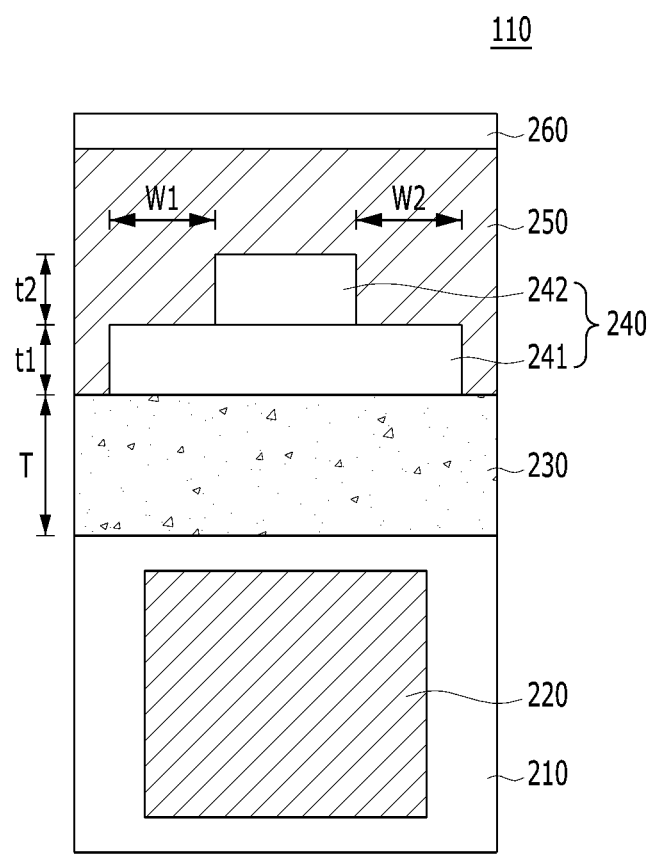
FIG. 2A is a cross-sectional view illustrating a unit pixel of the image sensor in accordance with the embodiment of the present invention.
Figure 2B:
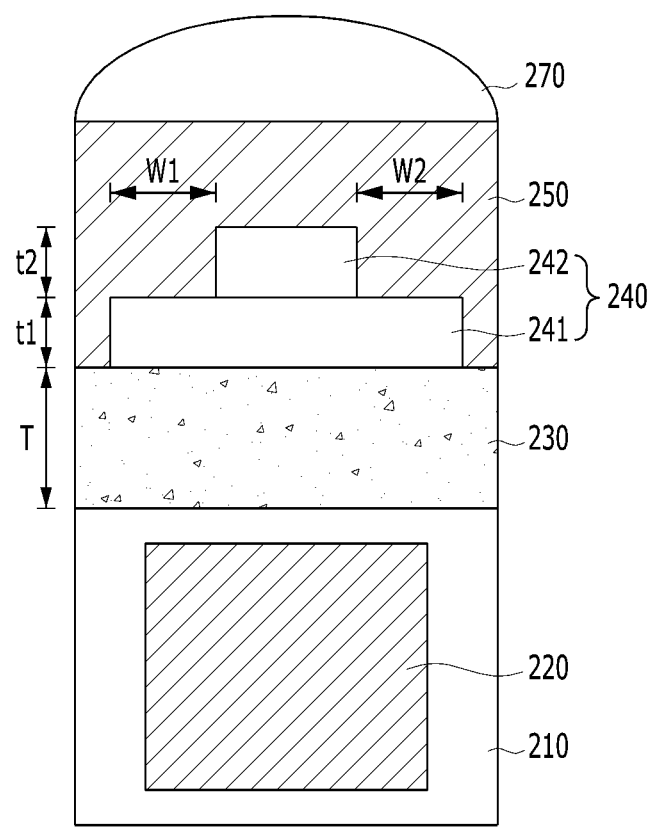
FIG. 2B is a cross-sectional view illustrating another embodiment of the present invention.
Figure 3A:
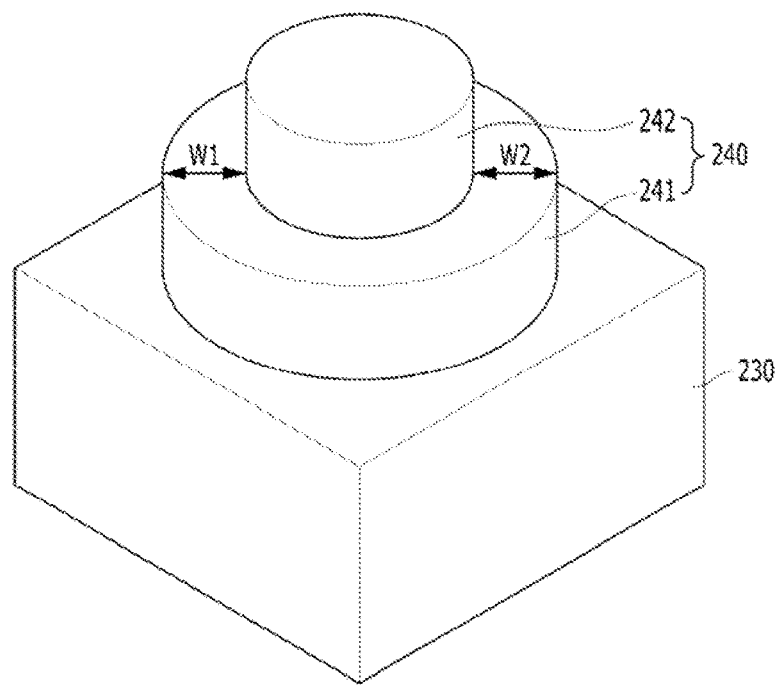
FIGS. 3A to 3C are perspective views illustrating a focusing layer and a pixel lens in accordance with an embodiment of the present invention.
Figure 3B:
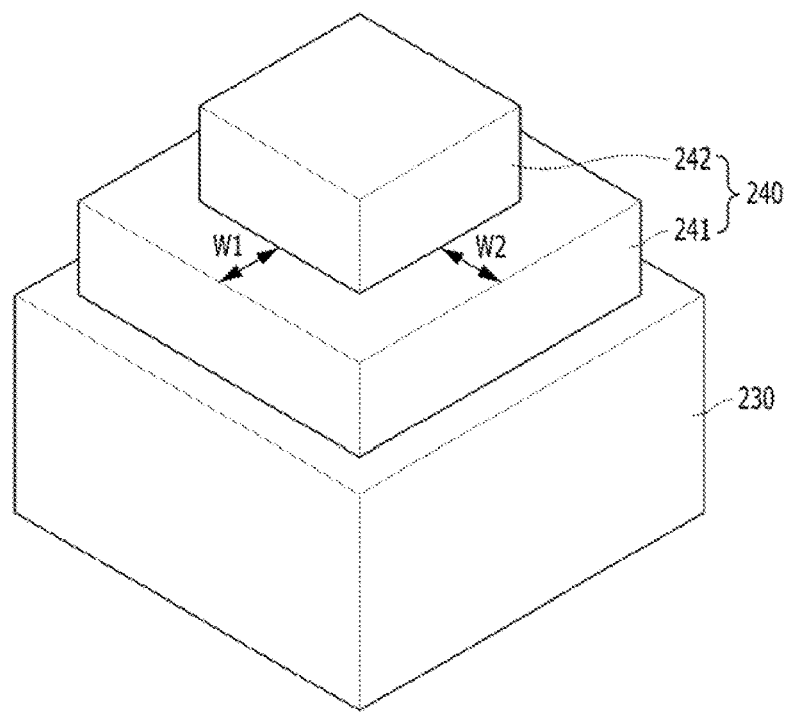
Figure 3C:
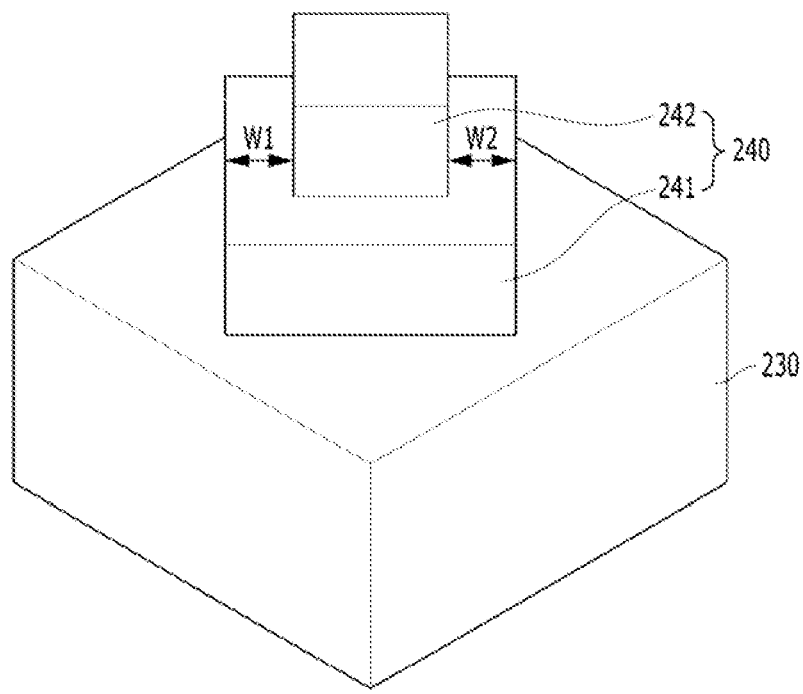

FIG. 2A is a cross-sectional view illustrating a unit pixel of an image sensor in accordance with the embodiment of the present invention, and FIG. 2B is a cross-sectional view illustrating another embodiment of the present invention. FIGS. 3A to 3C are perspective views illustrating examples of a focusing layer and a pixel lens in accordance with the embodiment of the present invention.

As illustrated in FIGS. 2A, 2B, and 3A to 3C, each of the unit pixels 110 may include a substrate 210, a focusing layer 230, a pixel lens 240, a color filter layer 250, and an anti-reflection structure 260 or 270. The substrate 210 may include a photoelectric conversion element 220. The focusing layer 230 may be formed over the substrate 210. The pixel lens 240 may be formed over the focusing layer 230 and include a plurality of light condensing layers. The plurality of light condensing layers in which a lower layer has a larger area or critical dimension (CD) than an upper layer. The color filter layer 250 may be formed over the focusing layer 230 so as to cover the pixel lens 240. The anti-reflection structure 260 or 270 may be formed over the color filter layer 250.

In the present embodiment, the pixel lens 240 may include a first light condensing layer 241 formed over the focusing layer 230 and a second light condensing layer 242 formed over the first light condensing layer 241 and having a smaller area than the first light condensing layer 241. The first light condensing layer 241 may form the lower layer, and the second light condensing layer 242 may form the upper layer. Thus, the first light condensing layer and the lower layer may be represented by the same reference numeral 241, and the second light condensing layer and the upper layer may be represented by the same reference numeral 242.

The substrate 210 may include a semiconductor substrate. The semiconductor substrate may have a single crystal state and include a silicon-containing material. That is, the substrate 210 may include a single-crystal silicon containing material.

The photoelectric conversion element 220 may include photo diodes. For example, the photoelectric conversion element 220 formed over the substrate 210 may include a plurality of photoelectric conversion layers (not illustrated) which are vertically stacked. Each of the photoelectric conversion layers may serve as a photodiode including an N-type impurity region and a P-type impurity region.

The focusing layer 230 may serve to adjust a distance at which incident light condensed through the pixel lens 240 reaches the photoelectric conversion element 220, that is, a focal distance. Due to the focusing layer 230, the focal distance may be adjusted without a variation of curvature, unlike a conventional device in which the focal distance is adjusted using a hemispherical micro lens with a given curvature. Furthermore, a shorter focal distance may be set within a limited space. The focal distance may be inversely proportional to the thickness T of the focusing layer 230. For example, the focal distance may be shortened as the thickness T of the focusing layer 230 is increased and lengthened as the thickness T of the focusing layer 230 is decreased.

To effectively transmit the incident light condensed through the pixel lens 240 to the photoelectric conversion element 220, the focusing layer 230 may have the same area as or a larger area than the pixel lens 240. The focusing layer 230 may have a shape corresponding to each of the unit pixels 110. Thus, between the adjacent unit pixels 110, the focusing layers 230 may be in contact with each other. For example, the focusing layer 230 may have a rectangular shape.

To more effectively transmit the incident light condensed through the pixel lens 240 to the photoelectric conversion element 220, the focusing layer 230 may have a larger refractive index than the pixel lens 240. As for the focusing layer 230, any materials having a larger refractive index than the pixel lens 240 may be applied.

Since the focusing layer 230 is positioned at the bottom of the color filter layer 250, various materials used in a typical semiconductor fabrication process can be applied. For example, transparent materials which can be applied as the focusing layer 230 may include inorganic materials such as silicon oxide, silicon nitride, and titanium nitride. The focusing layer 230 may have a single-layer structure or multilayer structure in which transparent materials having different refractive indexes are stacked. When the focusing layer 230 has a multilayer structure, the refractive index of the focusing layer 230 may vary depending on location. The refractive index of a layer located at a lower level may have a higher refractive index than a layer located at a higher level.

The pixel lens 240 may serve as a light condensing member to condense incident light. To improve light condensing efficiency, the pixel lens 240 may have a multilayer structure in which two or more light condensing layers 241 and 242 are stacked. The upper layer 242 may have a smaller area or CD than the lower layer 241. Thus, the pixel lens 240 may have a multilayer stepped structure. When the pixel lens 240 has a multilayer stepped structure, the difference in width, that is, each of the widths W1 and W2 may be smaller than the wavelength of incident light. That is, in the pixel lens, the lower layer exposed by the upper layer has a smaller width than the wavelength of incident light. More specifically, the difference in width, that is, each of the widths W1 and W2 between the upper layer 242 and the lower layer 241 may be smaller than the wavelength of the incident light of which colors are separated through the color filter layer 250. Through this structure, the pixel lens 240 having a multilayer stepped structure can condense light as a conventional hemispherical lens does. This is based on the sub-wavelength optics. The widths W1 and W2 form step widths between the upper layer 242 and the lower layer 241 at both ends respectively, and may be equal to each other (W1=W2) or different from each other (W1≠W2).

The plurality of light condensing layers 241 and 242 may have the same shape, and be arranged in parallel to each other. Specifically, the plurality of light condensing layers 241 and 242 may have a circular shape, a polygonal shape including a quadrangular shape, or the like.

To further improve light condensing efficiency, the thickness t2 of the upper layer 242 may be equal to the thickness t1 of the lower layer 241 (t1=t2), or smaller than the thickness t1 of the lower layer 241 (t1>t2). Furthermore, to further improve light condensing efficiency, the upper layer 242 may have the same refractive index as or a smaller effective refractive index than the lower layer 241. The plurality of light condensing layers 241 and 242 may include a transparent material. When the upper layer 242 and the lower layer 241 have the same refractive index, or when the upper layer 242 has a smaller effective refractive index than the lower layer 241, the upper layer 242 and the lower layer 241 may be formed of the same material.

Since the plurality of light condensing layers 241 and 242, that is, the pixel lens 240 is positioned at the bottom of the color filter layer 250, various materials used in a typical semiconductor fabrication process may be applied. For example, transparent materials which can be applied as the plurality of light condensing layers 241 and 242 may include inorganic materials such as silicon oxide, silicon nitride, and titanium nitride. The light condensing layers 241 and 242 may have a single-layer structure or multilayer structure in which transparent materials having different refractive indexes are stacked. When the plurality of light condensing layers is provided, the refractive indexes of the light condensing layers may vary depending on location. The refractive index of the light condensing layer located at a higher level may be smaller than the light condensing layer located at a lower level. That is, the refractive indexes of the light condensing layers may increase as the light condensing layers are adjacent to the photoelectric conversion element 220 or the focusing layer 230.

The color filter layer 250 for color separation may be formed over the focusing layer 230 to cover the pixel lens 240, and have a flat surface. Since the color filter layer 250 is in contact with the pixel lens 240 and covers the pixel lens 240, light transmission between the color filter layer 250 and the pixel lens 240 can be improved. That is, light condensing efficiency can be improved. The color filter layer 250 may include a red filter, a green filter, a blue filter, a cyan filter, a yellow filter, a magenta filter, an infrared pass filter, an infrared cutoff filter, a white filter, or a combination thereof. To further improve the light condensing efficiency, the color filter layer 250 may have a smaller refractive index than the pixel lens 240.

The anti-reflection structure 260 or 270 may be formed over the color filter layer 250 and include an anti-reflection layer 260 or a hemispherical lens 270. The anti-reflection layer 260 may include two or more material layers which have different refractive indexes and are alternately stacked one or more times. The hemispherical lens 270 may not only prevent reflection of incident light, but also condense light incident on the pixel lens 240.

As the image sensor having the above-described structure includes the pixel lens 240 having a multilayer stepped structure, the light condensing efficiency in the unit pixel 110 can be improved. Furthermore, as the color filter layer 250 has a shape to cover the pixel lens 240, the light condensing efficiency in the unit pixel 110 can be further improved. As the light condensing efficiency in the unit pixel 110 is improved, quantum efficiency in the photoelectric conversion element 220 can also be improved. As a result, the performance of the image sensor can be improved.

In the image sensor in accordance with an embodiment of the present invention, the focusing layer and the pixel lens may have a structure in which a plurality of material layers is stacked. Thus, an anti-reflection layer may be easily installed between the respective layers. The anti-reflection layer may prevent incident light from reflecting from the surface, thereby preventing a reduction in light condensing efficiency due to a reduction in light intensity. However, in the image sensor including a hemispherical micro lens, the formation positions of the anti-reflection layers may be limited. Hereafter, the anti-reflection layers will be described in detail with reference to FIGS. 4A to 4D. First to fifth anti-reflection layers illustrated in FIGS. 4A to 4D, respectively, may indicate that two or more material layers having different refractive indexes are alternately stacked one or more times.

FIGS. 4A to 4D are cross-sectional views illustrating the anti-reflection layers in accordance with an embodiment of the present invention.

Figure 4A:
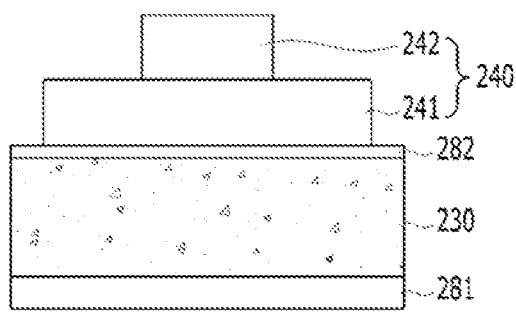
FIGS. 4A to 4D are cross-sectional views of anti-reflection layers in the focusing layer and the pixel lens in accordance with an embodiment of the present invention.

First, as illustrated in FIG. 4A, a first anti-reflection layer 281 may be formed under the focusing layer 230. Specifically, the first anti-reflection layer 281 may be formed between the focusing layer 230 and the substrate including the photoelectric conversion element. Furthermore, a second anti-reflection layer 282 may be formed between the focusing layer 230 and the pixel lens 240. The first and second anti-reflection layers 281 and 282 may be formed through a deposition process before and after the focusing layer 230 is formed.

Figure 4B:
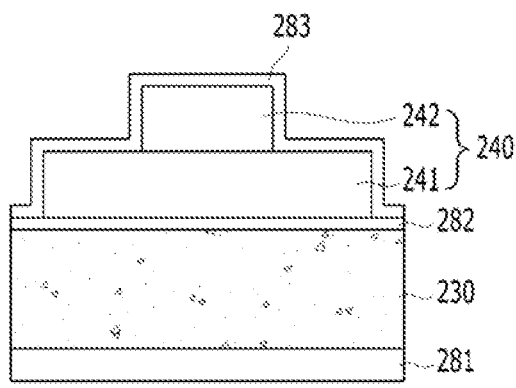

As illustrated in FIG. 4B, a third anti-reflection layer 283 may be formed over the pixel lens 240. Specifically, the third anti-reflection layer 283 may be formed between the pixel lens 240 and the color filter layer. The third anti-reflection layer 283 may be formed through a deposition process after the pixel lens 240 is formed. The deposition process may be performed in such a manner that the third anti-reflection layer 283 has a constant thickness along the surface of the structure.

Figure 4C:
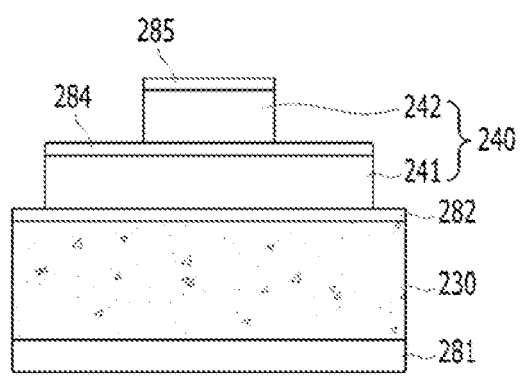

As illustrated in FIG. 4C, a fourth anti-reflection layer 284 may be formed over the first light condensing layer 241. A fifth anti-reflection layer 285 may be formed over the second light condensing layer 242. The fourth and fifth anti-reflection layers 284 and 285 may be formed at the same time as the first and second light condensing layers 241 and 242 are respectively formed. When the first and second light condensing layers 241 and 242 have different refractive indexes from each other, the fourth anti-reflection layer 284 may prevent surface reflection at the boundary surface between the first and second light condensing layers 241 and 242.

Figure 4D:
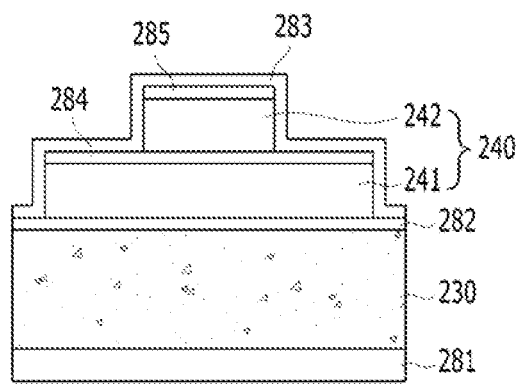

As illustrated in FIG. 4D, all of the first to fifth anti-reflection layers 281 to 285 may be formed. In the image sensor in accordance with an embodiment of the present invention, the focusing layer 230 and the pixel lens 240 may have a structure in which a plurality of material layers are stacked. Thus, an anti-reflection layer may be easily installed between the respective layers. Such a structure can further improve the light condensing efficiency.

The image sensor in accordance with an embodiment of the present invention may be used in various electronic devices or systems. Hereafter, the image sensor in accordance with an embodiment of the present invention which is applied to a camera will be described with reference to FIG. 5.

Figure 5:
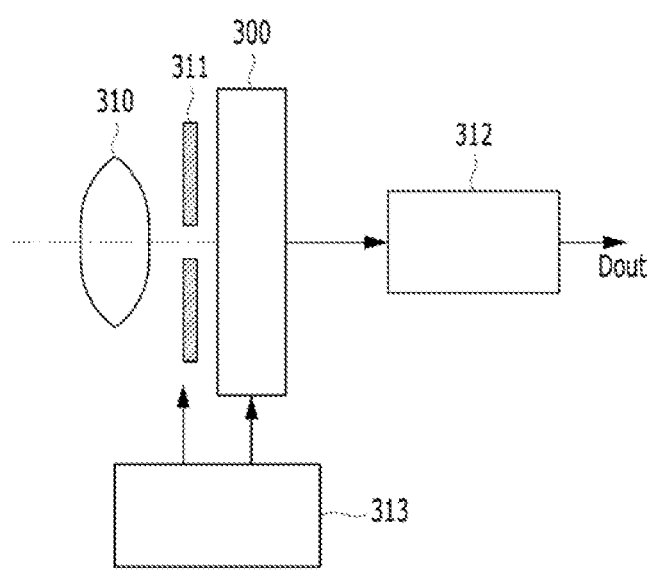
FIG. 5 is a diagram briefly illustrating an electronic device including an image sensor in accordance with an embodiment of the present invention.

FIG. 5 is a diagram briefly illustrating an electronic device including an image sensor in accordance with an embodiment of the present invention. Referring to FIG. 5, the electronic device including the image sensor in accordance with an embodiment of the present invention may include a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light that is, incident light, from an object to the pixel array 100 (refer to FIG. 1) of the image sensor 300. The optical system 310 may include a plurality of optical lenses. The shutter unit 311 may control a light irradiation period and a light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

In accordance with embodiments of the present invention, an image sensor may include a pixel lens to improve light condensing efficiency in the unit pixel. Furthermore, as the color filter layer has a shape to cover the pixel lens, the light condensing efficiency in the unit pixel can be further improved.

According to an embodiment, the light condensing efficiency in the unit pixel improves and quantum efficiency in the photoelectric conversion element improves. As a result, performance of the image sensor can be improved.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
    a substrate comprising a photoelectric conversion element;
    a pixel lens formed over the substrate and comprising a plurality of light condensing layers in which a lower layer has a larger area than an upper layer;
    a color filter layer covering an entire surface of the pixel lens; and
    an anti-reflection structure formed over the color filter layer, wherein the anti-reflection structure prevents reflection of incident light,
    wherein each of the plurality of light condensing layers has a flat surface, and the lower layer exposed by the upper layer has a smaller width than the wavelength of the incident light, and
    wherein the upper layer has a smaller effective refractive index than the lower layer, and the upper layer and the lower layer are formed of a same material.

2. The image sensor of claim 1, further comprising:
    a focusing layer provided between the photoelectric conversion element and the pixel lens.

3. The image sensor of claim 2, wherein the focusing layer has a larger refractive index than the pixel lens.

4. The image sensor of claim 2, wherein the focusing layer has the same area as or a larger area than the pixel lens.

5. The image sensor of claim 2, wherein a focal distance between the pixel lens and the photoelectric conversion element is inversely proportional to the thickness of the focusing layer.

6. The image sensor of claim 1, wherein the pixel lens has a multilayer stepped structure.

7. The image sensor of claim 1, wherein the lower layer exposed by the upper layer has a smaller width than the wavelength of incident light which colors are separated through the color filter layer.

8. The image sensor of claim 1, wherein the plurality of light condensing layers have the same shape and are arranged in parallel to each other.

9. The image sensor of claim 1, wherein the upper layer has the same thickness as or a smaller thickness than the lower layer.

10. The image sensor of claim 1, wherein the upper layer has the same refractive index as or a smaller refractive index than the lower layer.

11. The image sensor of claim 1, further comprising:
an anti-reflection layer formed over the pixel lens.

12. The image sensor of claim 1, wherein the color filter layer covers the entire surface of the pixel lens and has a flat top surface.

13. The image sensor of claim 1, wherein the color filter layer has a smaller refractive index than the pixel lens.

14. The image sensor of claim 1, wherein the anti-reflection structure comprises an anti-reflection layer or a hemispherical lens.

15. The image sensor of claim 1, wherein the color filter layer is contacted with the pixel lens.

16. An electronic device comprising:
an optical system;
an image sensor suitable for receiving light from the optical system and comprising a pixel array in which a plurality of unit pixels are arranged in a matrix shape; and
a signal processing unit suitable for processing a signal outputted from the image sensor,
wherein each of the unit pixels comprises:
a substrate comprising a photoelectric conversion element;
a pixel lens formed over the substrate and comprising a plurality of light condensing layers in which a lower layer has a larger area than an upper layer;
a color filter layer covering an entire surface of the pixel lens; and
an anti-reflection structure formed over the color filter layer, wherein the anti-reflection structure prevents reflection of incident light,
wherein each of the plurality of light condensing layers has a flat surface, and the lower layer exposed by the upper layer has a smaller width than the wavelength of the incident light, and
wherein the upper layer has a smaller effective refractive index than the lower layer, and the upper layer and the lower layer are formed of a same material.

17. The electronic device of claim 16, further comprising:
a focusing layer provided between the photoelectric conversion element and the pixel lens.

18. The electronic device of claim 17, wherein the focusing layer has a larger refractive index than the pixel lens, and
wherein the color filter layer has a smaller refractive index than the pixel lens.

19. The electronic device of claim 17, wherein a focal distance between the pixel lens and the photoelectric conversion element is inversely proportional to the thickness of the focusing layer.

20. The image sensor of claim 16, wherein the color filter layer is contacted with the pixel lens.

* * * * *